(12) United States Patent
Kang

(10) Patent No.: US 11,243,828 B2
(45) Date of Patent: Feb. 8, 2022

(54) SEMICONDUCTOR APPARATUS AND SEMICONDUCTOR SYSTEM INCLUDING THE SEMICONDUCTOR APPARATUS

(71) Applicant: SK hynix Inc., Icheon-si (KR)

(72) Inventor: Jae Yong Kang, Seoul (KR)

(73) Assignee: SK hynix Inc., Icheon-si (KR)

( * ) Notice: Subject to any disclaimer, the term of this patent is extended or adjusted under 35 U.S.C. 154(b) by 134 days.

(21) Appl. No.: 16/709,796

(22) Filed: Dec. 10, 2019

(65) Prior Publication Data

US 2020/0327003 A1 Oct. 15, 2020

(30) Foreign Application Priority Data

Apr. 15, 2019 (KR) .................. 10-2019-0043912

(51) Int. Cl.
| | |
|---|---|
| *G06F 11/00* | (2006.01) |
| *G06F 11/07* | (2006.01) |
| *G11C 11/419* | (2006.01) |
| *G06F 12/0879* | (2016.01) |
| *G06F 9/30* | (2018.01) |
| *G11C 17/14* | (2006.01) |
| *G06F 11/10* | (2006.01) |

(52) U.S. Cl.
CPC ........ *G06F 11/073* (2013.01); *G06F 9/30101* (2013.01); *G06F 11/076* (2013.01); *G06F 11/0772* (2013.01); *G06F 11/1044* (2013.01); *G06F 12/0879* (2013.01); *G11C 11/419* (2013.01); *G11C 17/146* (2013.01)

(58) Field of Classification Search
CPC .. G06F 11/073; G06F 11/076; G06F 11/0772; G06F 11/1044; G06F 11/0766; G06F 11/0784
See application file for complete search history.

(56) References Cited

U.S. PATENT DOCUMENTS

| | | | |
|---|---|---|---|
| 9,870,837 B1 | 1/2018 | Shim | |
| 2015/0221361 A1* | 8/2015 | Lee | ........................ G11C 11/408 365/96 |
| 2016/0307645 A1* | 10/2016 | Kim | .................. G11C 29/4401 |
| 2018/0232267 A1 | 8/2018 | Koo et al. | |
| 2019/0237154 A1* | 8/2019 | Choi | ...................... G11C 29/02 |

* cited by examiner

*Primary Examiner* — Katherine Lin
(74) *Attorney, Agent, or Firm* — William Park & Associates Ltd.

(57) ABSTRACT

A semiconductor system according to an embodiment includes: a semiconductor system including a normal memory cell array and a redundancy memory cell array for repairing a defective cell among memory cells within the normal memory cell array, and configured to output to an external a fail flag generated according to a number of fail bits within read data output from the redundancy memory cell array; and a host configured to store an address corresponding to the read data into a selected register group from among a plurality of register groups, the selected register group being matched to the fail flag.

16 Claims, 8 Drawing Sheets

SEMICONDUCTOR APPARATUS AND SEMICONDUCTOR SYSTEM INCLUDING THE SEMICONDUCTOR APPARATUS

CROSS-REFERENCES TO RELATED APPLICATION

The present application claims priority under 35 U.S.C. § 119(a) to Korean application number 10-2019-0043912, filed on Apr. 15, 2019, in the Korean Intellectual Property Office, which is incorporated herein by reference in its entirety as set forth in full.

BACKGROUND

1. Technical Field

Various examples of embodiments of the present disclosure generally relate to a semiconductor circuit and, more particularly, to a semiconductor apparatus and a semiconductor system including the semiconductor apparatus.

2. Related Art

A semiconductor apparatus may include a normal memory cell array and a redundancy memory cell array.

Through a test process, a semiconductor apparatus may detect a normal memory cell (hereinafter, referred to as a defective cell) that cannot be utilized and may store, into a separate storage apparatus, an address (hereinafter, referred to as a defective address) for accessing the defective cell.

Among redundancy memory cells, utilized may be redundancy memory cells satisfying a particular condition, for example, a condition capable of Error Correction Code (ECC) correction.

Since the redundancy memory cells have an important role to replace the normal memory cells, it is important to more effectively and relatively manage the redundancy memory cells thereby increasing reliability and durability of a semiconductor apparatus.

SUMMARY

In an embodiment of the present disclosure, a semiconductor system may include: a semiconductor apparatus including a normal memory cell array and a redundancy memory cell array for repairing a defective cell among memory cells within the normal memory cell array, and configured to output to an external a fail flag generated according to a number of fail bits within read data output from the redundancy memory cell array; and a host configured to store an address corresponding to the read data into a selected register group from among a plurality of register groups, the selected register group being matched to the fail flag.

In an embodiment of the present disclosure, a semiconductor apparatus may include: a normal memory cell array; a redundancy memory cell array for repairing a defective cell among memory cells within the normal memory cell array; a fail information control circuit configured to generate information on a number of fail bits within read data output from a memory cell within the redundancy memory cell array; a register array including a plurality of register groups; and a test circuit configured to store write data into the memory cell within the redundancy memory cell array, configured to control the memory cell within the redundancy memory cell array to output the read data, and configured to store an address corresponding to the read data into a selected register group from among the plurality of register groups, the selected register group from among the plurality of register groups corresponding to the information on the number of fail bits within the read data.

BRIEF DESCRIPTION OF THE DRAWINGS

Features, aspects and embodiments are described in conjunction with the attached drawings, in which.

DETAILED DESCRIPTION

Hereinafter, a semiconductor apparatus according to the present disclosure will be described below with reference to the accompanying drawings through examples of embodiments.

Various embodiments of the present disclosure may provide a semiconductor apparatus capable of effectively and reliably manage and utilize redundancy memory cells and a semiconductor system including the semiconductor apparatus.

Figure 1:
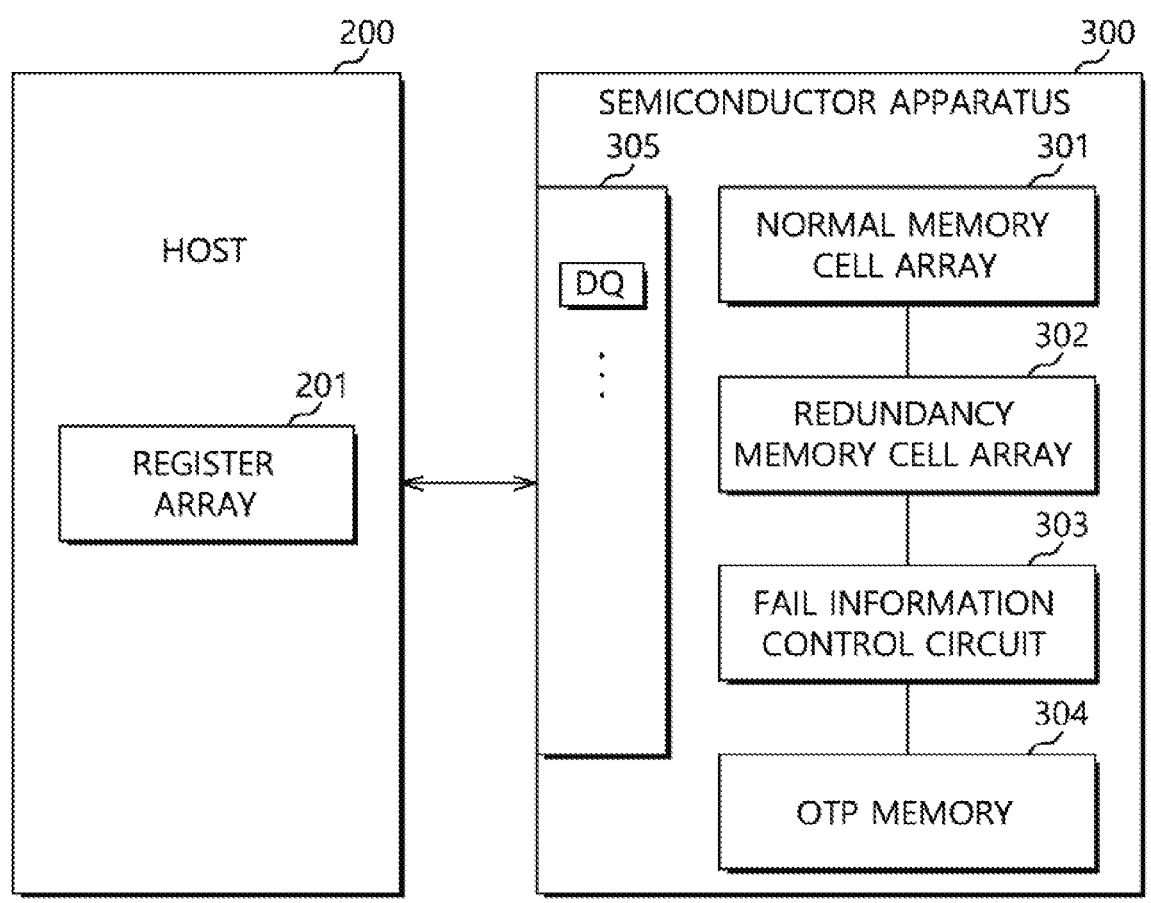
FIG. 1 is a diagram illustrating a representation of an example of a configuration of a semiconductor system in accordance with an embodiment of the present disclosure.

FIG. 1 is a diagram illustrating a representation of an example of a configuration of a semiconductor system in accordance with an embodiment of the present disclosure.

Referring to FIG. 1, in accordance with an embodiment of the present disclosure, the semiconductor system 100 may include a host 200 and a semiconductor apparatus 300.

The semiconductor apparatus 300 may include a normal memory cell array 301, a redundancy memory cell array 302, a fail information control circuit 303, a one-time programmable (OTP) memory 304 and input/output pads 305.

The redundancy memory cell array 302 may include redundancy memory cells each configured to repair a memory cell (hereinafter, referred to as a defective cell) that cannot be utilized among memory cells of the normal memory cell array 301.

The fail information control circuit 303 may generate a counting signal by counting a number of fail bits through comparison between write data and read data per an address. The fail information control circuit 303 may generate a corrected counting signal by correcting the counting signal.

Write data provided to the fail information control circuit 303 may have a predetermined pattern (e.g., 0 or 1) for a test. The word "predetermined" as used herein with respect to a parameter, such as a predetermined pattern, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Read data provided to the fail information control circuit 303 may be read per an address from the redundancy memory cell array 302.

The fail information control circuit 303 may reset remaining bits other than a most significant bit having a value of '1' among a plurality of bits of the counting signal and output, as the corrected counting signal, the counting signal including the reset bits, which will be described with reference to FIG. 6.

The OTP memory 304 may include an electrical fuse (e-fuse) array such that it is possible to perform a repair operation after packaging of the semiconductor apparatus 300 as well as before packaging of the semiconductor apparatus 300.

The OTP memory 304 may store, into the electrical fuse array, an address for accessing a normal memory cell (i.e., a defective cell) that cannot be utilized within the normal memory cell array 301.

The input/output pads 305 may include data input/output pads DQ.

The host 200 may include a register array 201.

For example, the host 200 may be a test equipment. The host 200 may provide the semiconductor apparatus 300 with a command, an address and/or write data. The host 200 may determine pass/fail of a normal memory cell and/or a redundancy memory cell, which corresponds to an address, according to read data output from the semiconductor apparatus 300.

The host 200 may store a read address into a register group, which is matched to a fail flag, among a plurality of register groups of the register array 201. In an embodiment, the host 200 may store a read address into a register group selected from a plurality of register groups of the register array 201. In an embodiment, the fail flag may indicate which register group should be selected among the plurality of register groups by the register array 201 to store an address corresponding to a number of failed bits in the read data RDATA. In an embodiment, the register group that is selected may be referred to as the selected memory group.

The read address may be provided, together with a read command for scan of the redundancy memory cell array 302, to the semiconductor apparatus 300 from the host 200 in a test operation.

The fail flag may define a number of fail bits according to a timing when the fail flag is generated, which will be described later.

The counting signal, the corrected counting signal and the fail flag may be utilized as information about a number of fail bits of the read data.

Figure 2:
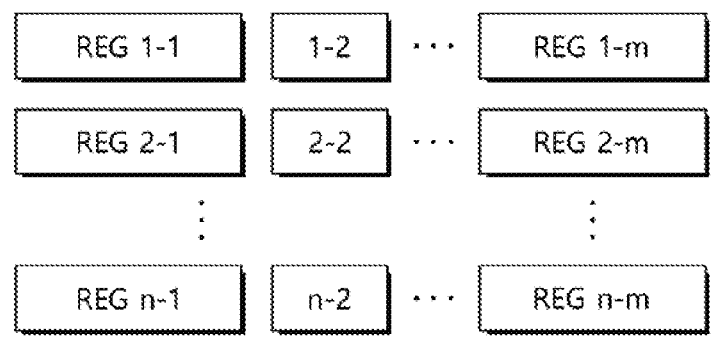
FIG. 2 is a diagram illustrating a representation of an example of a configuration of a register array illustrated in FIG. 1.

FIG. 2 is a diagram illustrating a representation of an example of a configuration of a register array illustrated in FIG. 1.

Referring to FIG. 2, the register array 201 may include a plurality of registers. The plurality of registers may be divided into a plurality of register groups, that is, a first register group REG 1-1 to REG 1-$m$ to a $(n-1)^{th}$ register group REG n-1 to REG n-m.

A greater number of fail bits in read data may represent that redundancy memory cells corresponding to read addresses corresponding to the read data have lower reliability. A smaller number of fail bits in read data may represent that redundancy memory cells corresponding to read addresses corresponding to the read data have higher reliability.

Therefore, according to the fail flag, the host 200 may distinctively store the corresponding addresses into the first register group REG 1-1 to REG 1-$m$ to the $(n-1)^{th}$ register group REG n-1 to REG n-m.

Here, a number of fail bits defined by the fail flag may correspond to an ascending order of the first register group REG 1-1 to REG 1-$m$ to the $(n-1)^{th}$ register group REG n-1 to REG n-m.

That is, the host 200 may store read addresses of greater number of fail bits into the first register group REG 1-1 to REG 1-$m$ to the $(n-1)^{th}$ register group REG n-1 to REG n-m in an ascending order of the first register group REG 1-1 to REG 1-$m$ to the $(n-1)^{th}$ register group REG n-1 to REG n-m.

For example, when any fail bit is not counted or a smallest number of fail bits are counted in a read data, corresponding read addresses may be sequentially stored in the first register group REG 1-1 to REG 1-$m$.

Sequentially stored in the second register group REG 2-1 to REG 2-$m$ may be read addresses, fail bits of which are counted by relatively greater numbers in the read data than the read addresses stored in the first register group REG 1-1 to REG 1-$m$.

In the similar way, sequentially stored in the $(n-1)^{th}$ register group REG n-1 to REG n-m may be read addresses, fail bits of which are counted by greatest numbers in the read data.

The host 200 may determine the reliability (i.e., operation performance) of a redundancy memory cell according to a location where a corresponding address is stored among the first register group REG 1-1 to REG 1-$m$ to the $(n-1)^{th}$ register group REG n-1 to REG n-m of the register array 201.

When it is decided to repair the normal memory cells, the host 200 may preferentially utilize the addresses stored in the first register group REG 1-1 to REG 1-$m$. When all the addresses stored in the first register group REG 1-1 to REG 1-$m$ are utilized, the host 200 may then utilize the addresses stored in the second register group REG 2-1 to REG 2-$m$ to the $(n-1)^{th}$ register group REG n-1 to REG n-m in an ascending order of the register groups.

Figure 3:
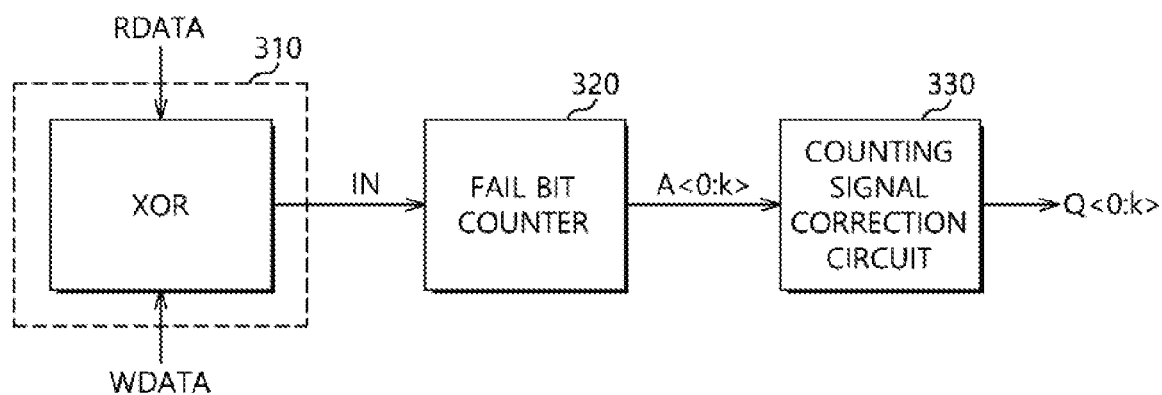
FIG. 3 is a diagram illustrating a representation of an example of a configuration of a fail information control circuit illustrated in FIG. 1.

FIG. 3 is a diagram illustrating a representation of an example of a configuration of a fail information control circuit illustrated in FIG. 1.

Referring to FIG. 3, the fail information control circuit 303 may include a comparison circuit 310, a fail bit counter 320 and a counting signal correction circuit 330.

The comparison circuit 310 may generate a comparison result signal IN by comparing read data RDATA with write data WDATA.

The write data WDATA may have a predetermined pattern (e.g., all '0' or all '1') known to both of the host 200 and the semiconductor apparatus 300 and thus the semiconductor apparatus 300 may generate by itself the write data WDATA by utilizing a level of power supply voltage or a level of ground voltage.

The comparison circuit 310 may perform an XOR operation and may include, for example, XOR logic. The XOR logic may be implemented as hardware, software, or a combination of hardware and software. For example, the XOR logic may be a XOR logic circuit operating in accordance with an algorithm and/or a processor executing XOR logic code.

The XOR logic may compare the read data RDATA with the write data WDATA on a bit-by-bit basis. The XOR logic may output the comparison result signal IN having a low level when the read data RDATA is the same as the write data WDATA and may output the comparison result signal IN having a high level when the read data RDATA is not the same as the write data WDATA.

The high level of the comparison result signal IN may represent occurrence of a fail bit due to abnormality of a corresponding redundancy memory cell.

The fail bit counter 320 may generate a counting signal A<0:K> by counting the comparison result signal IN.

The counting signal correction circuit 330 may reset, to a low level, remaining bits other than a most significant bit having a high level among a plurality of bits of the counting signal A<0:K> and output, as the corrected counting signal Q<0:K>, the counting signal including the reset bits.

Figure 4:
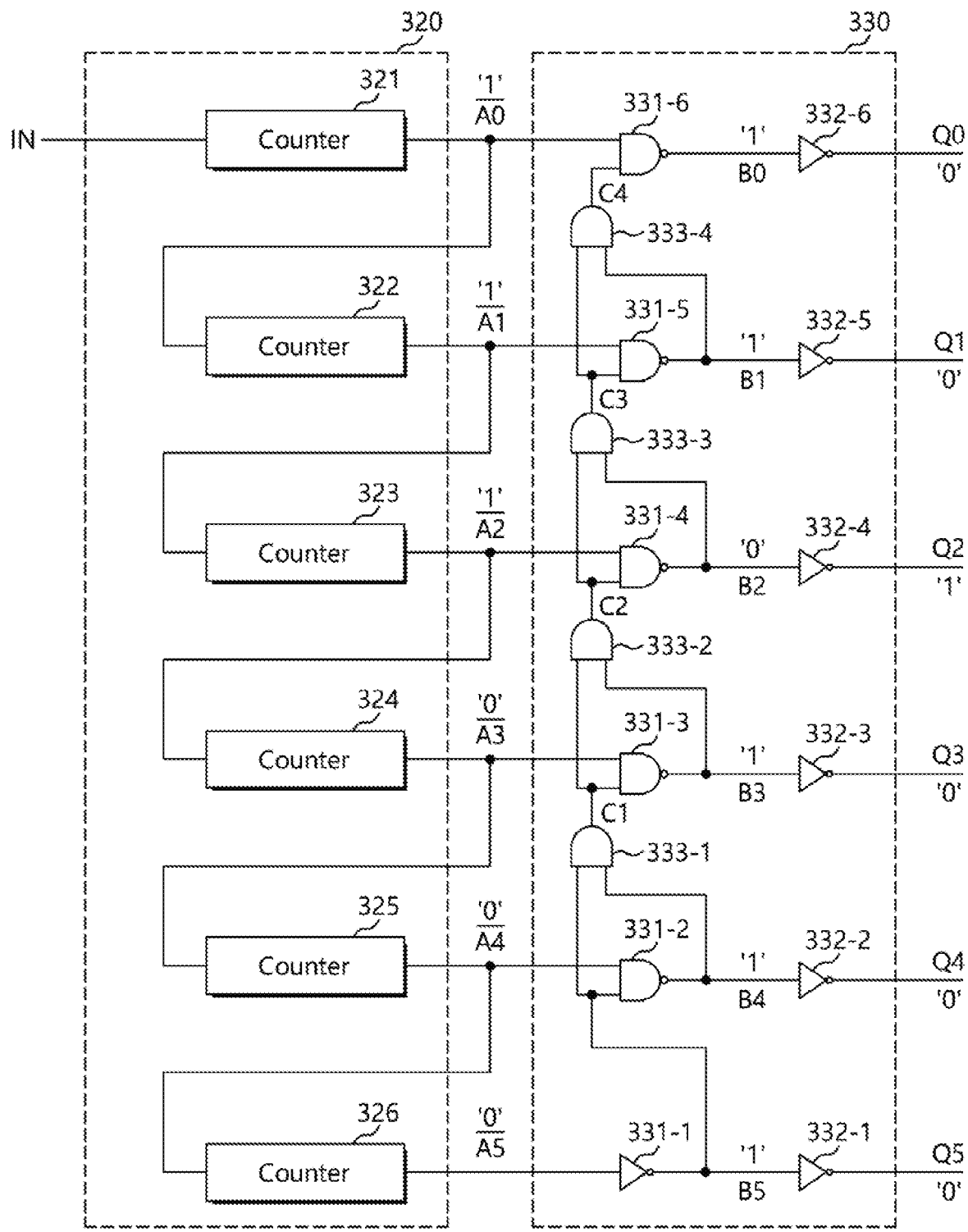
FIG. 4 is a diagram illustrating a representation of an example of configurations of a fail bit counter and a counting signal correction circuit illustrated in FIG. 3.
Figure 5:
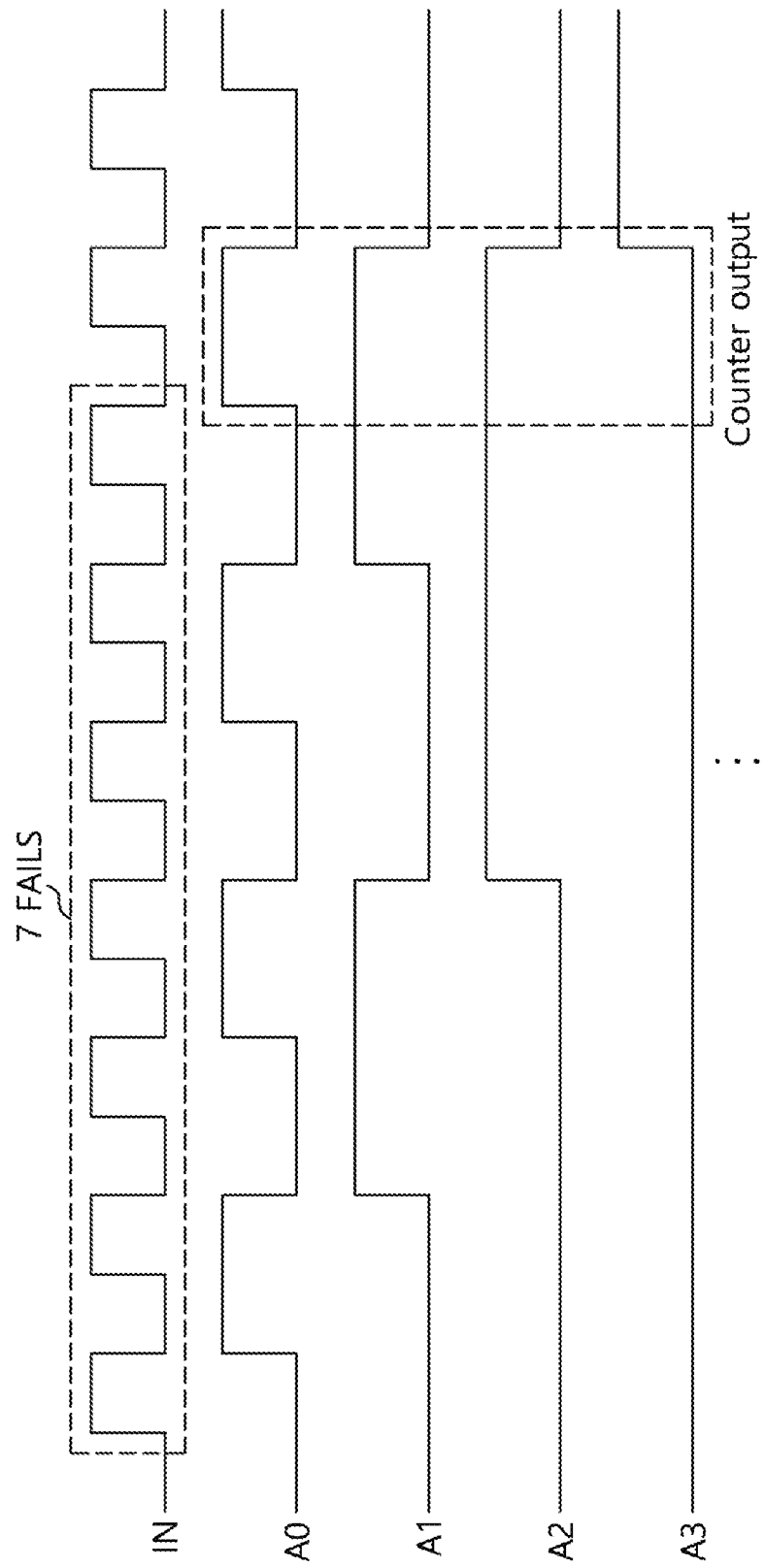
FIG. 5 is a timing diagram illustrating a representation of an example of an operation of a fail bit counter illustrated in FIG. 4.

FIG. 4 is a diagram illustrating a representation of an example of configurations of a fail bit counter and a counting signal correction circuit illustrated in FIG. 3 and FIG. 5 is a timing diagram illustrating a representation of an example of an operation of a fail bit counter illustrated in FIG. 4.

FIG. 4 provides, for example, the fail bit counter 320 and the counting signal correction circuit 330 configured to generate the counting signal A<0:K> of 6 bits (i.e., A<0:5>, K=5) and the corrected counting signal Q<0:K> of 6 bits (i.e., Q<0:5>, K=5), respectively.

Referring to FIG. 4, the fail bit counter 320 may include a plurality of unit counters 321 to 326.

The plurality of unit counters 321 to 326 may be configured to generate the counting signal A<0:5> by counting the comparison result signal IN or outputs A0, A1, A2, A3 and A4 of a counter of a previous turn.

Referring to FIG. 5, the fail bit counter 320 may sequentially toggle the counting signal A<0:5> from a least significant bit A0 by binarily counting a pulse of the comparison result signal IN.

For example, at a time point when seven (7) fail bits are counted among the pulses of the comparison result signal IN, the counting signal A<0:5> may have a value of '111000'.

The counting signal correction circuit 330 may include a plurality of inverters 331-1 and 332-1 to 332-6, a plurality of NAND gates 331-2 to 331-6 and a plurality of AND gates 333-1 to 333-4.

A first inverter 333-1 may invert a value of a bit A5 within the counting signal A<0:5> and may output the inverted value as a value of a signal B5.

A second inverter 332-1 may invert the value of the signal B5 and may output the inverted value as a value of a bit Q5 within the corrected counting signal Q<0:5>.

A first NAND gate 331-2 may perform a NAND operation on values of the signal B5 and a bit A4 within the counting signal A<0:5> and may output a result of the NAND operation as a value of a signal B4.

A third inverter 332-2 may invert the value of the signal B4 and may output the inverted value as a value of a bit Q4 within the corrected counting signal Q<0:5>.

A first AND gate 333-1 may perform an AND operation on the values of the signal B4 and the signal B5 and may output a result of the AND operation as a value of a signal C1.

A second NAND gate 331-3 may perform a NAND operation on the values of the signal C1 and a bit A3 within the counting signal A<0:5> and may output a result of the NAND operation as a value of a signal B3.

A fourth inverter 332-3 may invert the value of the signal B3 and may output the inverted value as a value of a bit Q3 within the corrected counting signal Q<0:5>.

A second AND gate 333-2 may perform an AND operation on the values of the signal B3 and the signal C1 and may output a result of the AND operation as a value of a signal C2.

A third NAND gate 331-4 may perform a NAND operation on the values of the signal C2 and a bit A2 within the counting signal A<0:5> and may output a result of the NAND operation as a value of a signal B2.

A fifth inverter 332-4 may invert the value of the signal B2 and may output the inverted value as a value of a bit Q2 within the corrected counting signal Q<0:5>.

A third AND gate 333-3 may perform an AND operation on the values of the signal B2 and the signal C2 and may output a result of the AND operation as a value of a signal C3.

A fourth NAND gate 331-5 may perform a NAND operation on the values of the signal C3 and a bit A1 within the counting signal A<0:5> and may output a result of the NAND operation as a value of a signal B1.

A sixth inverter 332-5 may invert the value of the signal B1 and may output the inverted value as a value of a bit Q1 within the corrected counting signal Q<0:5>.

A fourth AND gate 333-4 may perform an AND operation on the values of the signal B1 and the signal C3 and may output a result of the AND operation as a value of a signal C4.

A fifth NAND gate 331-6 may perform a NAND operation on the values of the signal C4 and a bit A0 within the counting signal A<0:5> and may output a result of the NAND operation as a value of a signal B0.

A seventh inverter 332-6 may invert the value of the signal B0 and may output the inverted value as a value of a bit Q0 within the corrected counting signal Q<0:5>.

As described above with reference to FIG. 4, when the counting signal A<0:5> has a value of '111000', the logics of the counting signal correction circuit 330 may output the corrected counting signal Q<0:5> having a value of '001000' by resetting, to a value of '0', the remaining bits A0, A1, A3 to A5 other than the most significant bit A2 having a value of '1' within the value of '111000'.

Figure 6:
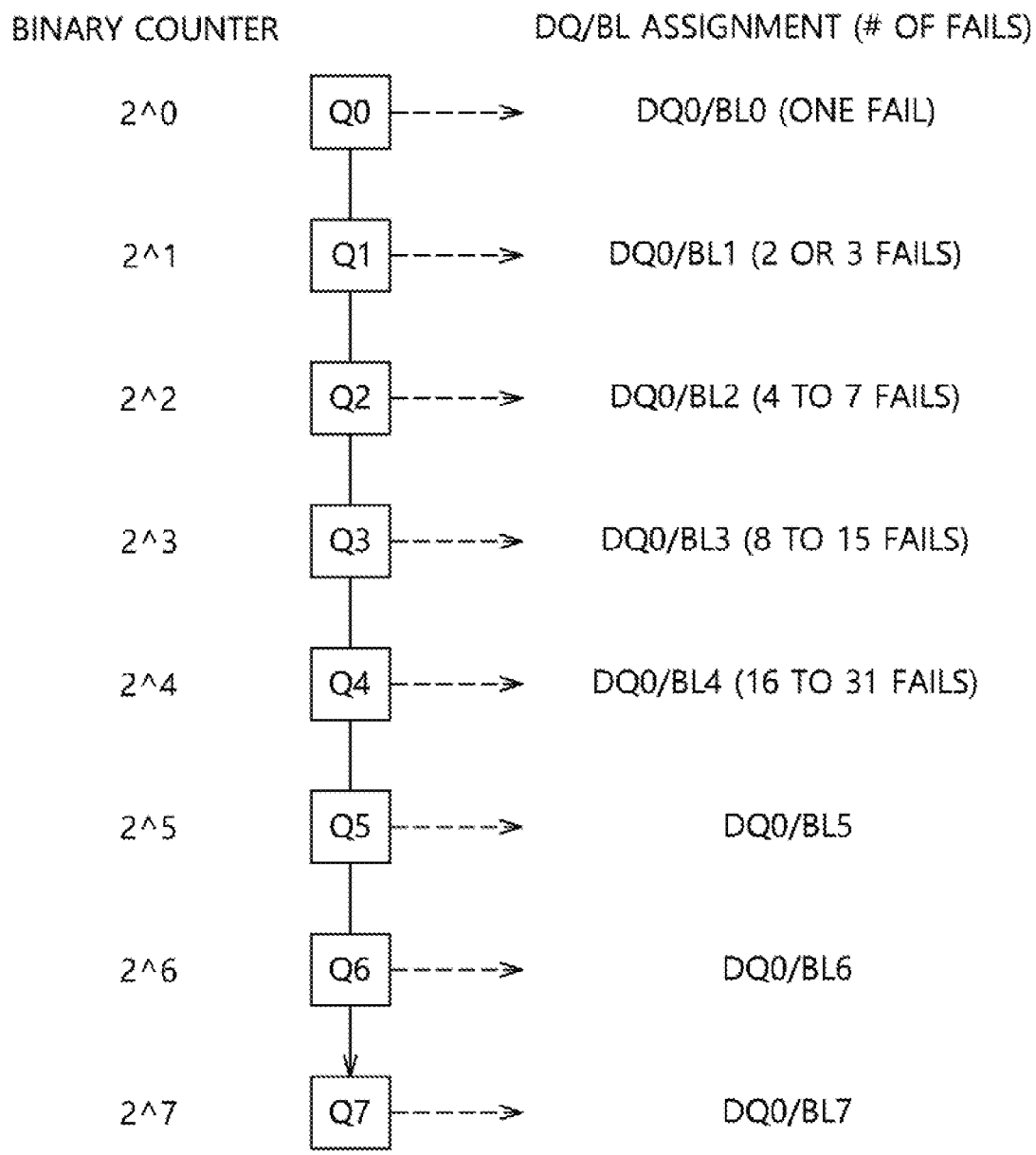
FIG. 6 is a diagram illustrating a representation of an example of a fail flag output scheme in accordance with an embodiment of the present disclosure.

FIG. 6 is a diagram illustrating a representation of an example of a fail flag output scheme in accordance with an embodiment of the present disclosure.

In accordance with an embodiment of the present disclosure, the semiconductor apparatus 300 may provide the host 200 with the fail flag according to the corrected counting signal Q<0:K> described with reference to FIGS. 4 and 5.

The semiconductor apparatus 300 may provide the host 200 with the fail flag through the data input/output pads DQ.

The semiconductor apparatus 300 may include the fail flag as a piece within each data of a burst length BL (e.g., BL0, BL1 and BL2 to BLn, n=5), the data being output through one (e.g., DQ0) among the data input/output pads DQ.

The corrected counting signal Q<0:K> may be utilized as the fail flag.

FIG. 6 provides, for example, the bits A0 to A5 of the counting signal A<0:K> (K=5) matched to the data BL0 to BL5, respectively.

The counting signal A<0:5> may have two or more bits having a value of '1' according to a number of fail bits. Therefore, an identification process of the host 200 may be complicated when the counting signal A<0:5> itself is included as the fail flag into the data BL<0:5> corresponding to the input/output pad DQ0.

In accordance with an embodiment of the present disclosure, by utilizing the counting signal correction circuit 330 described with reference to FIG. 5, the corrected counting signal Q<0:5> may be included as the fail flag into the data BL<0:5> corresponding to the input/output pad DQ0 and may be provided to the host 200, the corrected counting signal Q<0:5> being a result of resetting, to a value of '0', remaining bits other than a most significant bit having a value of '1' among a plurality of bits of the counting signal A<0:5>.

The bit Q0 may represent a binary number '$2^0$' and the bit Q0 having a high level may be included into the data BL0 to define occurrence of a single fail bit.

The bit Q1 may represent a binary number '$2^1+2^0$' and the bit Q1 having a high level may be included into the data BL1 to define occurrence of two or three fail bits.

The bit Q2 may represent a binary number '$2^2+2^1+2^0$' and the bit Q2 having a high level may be included into the data BL2 to define occurrence of four to seven (4 to 7) fail bits.

In the similar way, the bit Q3 having a high level may be included into the data BL3 to define occurrence of eight to fifteen (8 to 15) fail bits; the bit Q4 having a high level may be included into the data BL4 to define occurrence of sixteen to thirty one (16 to 31) fail bits; and the bit Q5 having a high level may be included into the data BL5 to define occurrence of thirty two to sixty three (32 to 63) fail bits.

The corrected counting signal Q<0:5>, within which all bits have a low level may be assigned to the data BL<0:5> to define no occurrence of a fail bit.

The above described example may be merely an example of the corrected counting signal Q<0:5> assigned as the fail flag to the data BL<0:5> corresponding to the input/output pad DQ0. However, different input/output pad may be utilized. Further, occurrence of greater number of fail bits may be defined when a circuit configuration is made to increase a number of bits within the counting signal A<0:K>.

Hereinafter, described with reference to FIGS. 7 to 9 will be a method of managing a redundancy memory cell in accordance with an embodiment.

Figure 7:
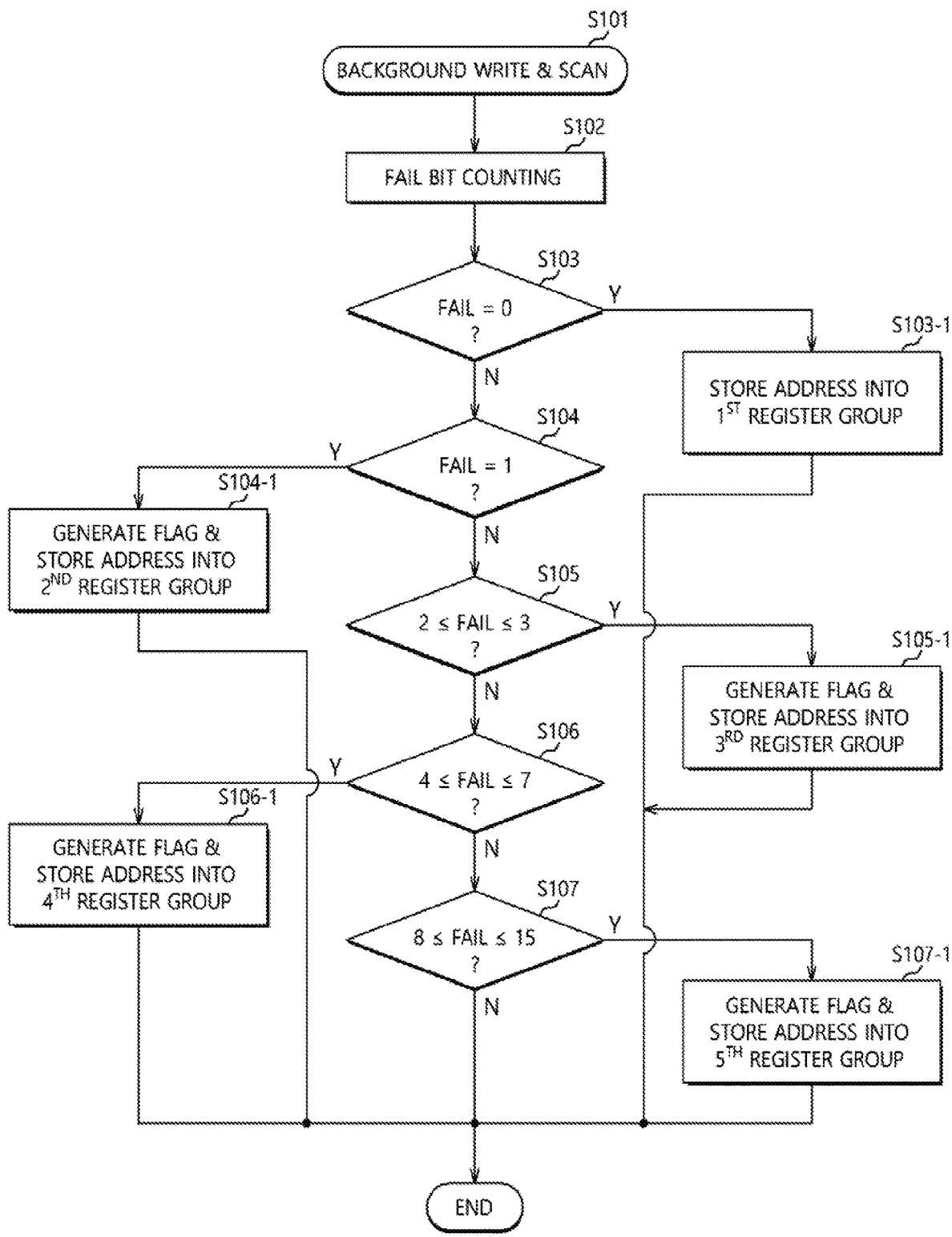
FIG. 7 is a flowchart illustrating a representation of an example of a method of managing a redundancy memory cell in accordance with an embodiment of the present disclosure.

FIG. 7 is a flowchart illustrating a representation of an example of a method of managing a redundancy memory cell in accordance with an embodiment of the present disclosure. FIG. 8 is a diagram illustrating a representation of an example of a method of background write and scan of a redundancy memory cell array illustrated in FIG. 7. FIG. 9 is a diagram illustrating a representation of an example of a fail flag output scheme illustrated in FIG. 7.

Referring to FIG. 7, preceding operations (e.g., background write operation and scan operation) for managing fail information may be performed (S101).

Figure 8:
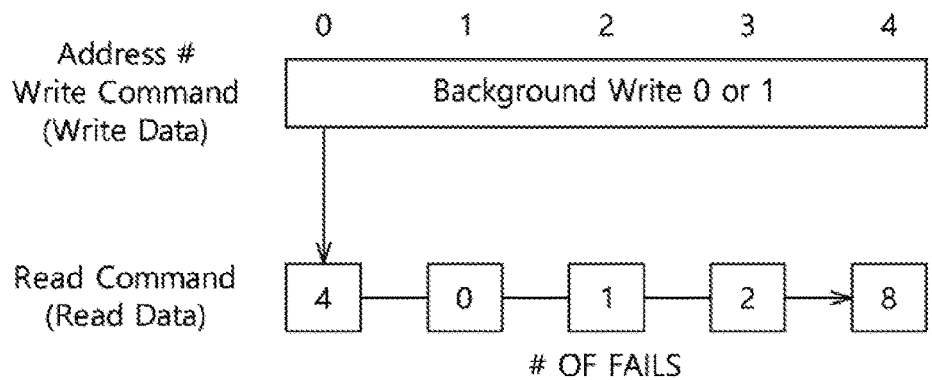
FIG. 8 is a diagram illustrating a representation of an example of a method of background write and scan of a redundancy memory cell array illustrated in FIG. 7.
Figure 9:
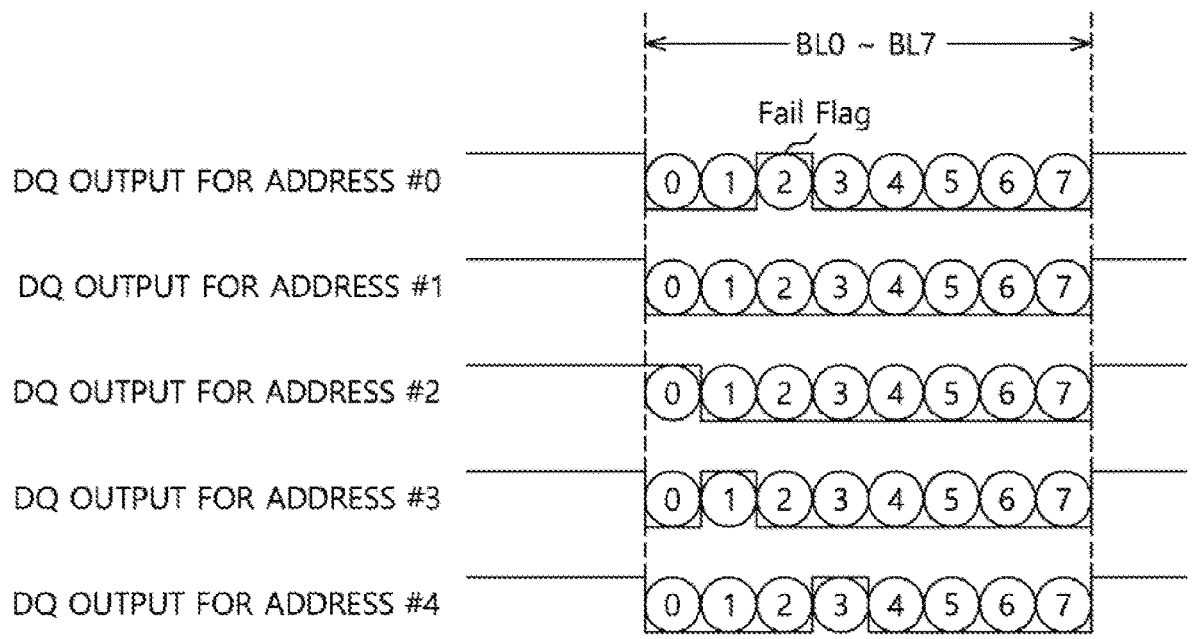
FIG. 9 is a diagram illustrating a representation of an example of a fail flag output scheme illustrated in FIG. 7.

Referring to FIG. 8, in the background write operation, the host 200 may provide the semiconductor apparatus 300 with the write command and the write data of a predetermined pattern (e.g., all '0' or all '1') sequentially for addresses Address #0 to #4 and the semiconductor apparatus 300 may write the write data into redundancy memory cells corresponding to the addresses Address #0 to #4 within the redundancy memory cell array 302 according to the write command.

In the scan operation, the host 200 may provide the semiconductor apparatus 300 with a read command sequentially for the addresses Address #0 to #4 and the semiconductor apparatus 300 may read data from redundancy memory cells corresponding to the addresses Address #0 to #4 within the redundancy memory cell array 302 according to the read command.

Then, a fail bit counting operation may be performed (S102). In the fail bit counting operation, the read data read from the redundancy memory cell array 302 may be compared with the write data and a number of fail bits, which are different from each other between the read data and the writ data, may be counted. The fail bit counter 320 may perform the fail bit counting operation.

In subsequent steps S103 to S107-1, as one or more fail bits occur, the corrected counting signal Q<0:5> may be output as the fail flag through the data BL<0:5> corresponding to the input/output pad DQ0 and corresponding addresses may be distinctively stored, according to a number of fail bits, into the first register group REG 1-1 to REG 1-m to the (n-1)$^{th}$ register group REG n-1 to REG n-m.

Prior to the description about the subsequent steps S103 to S107-1, described with reference to FIG. 9 will be an example of an operation of outputting the fail flag to the host 200 through the data BL<0:5> corresponding to the input/output pad DQ0 as one or more fail bits occur.

As illustrated in FIG. 8, it is assumed that numbers of fail bits corresponding to the addresses Address #0 to #4 are 4, 0, 1 and 8, respectively.

The number of fail bits corresponding to the address Address #0 may be 4 and thus only the bit Q2 may have a high level within the corrected counting signal Q<0:5>. Therefore, the fail flag may be generated according to the bit Q2 having a high level at a time point corresponding to the data BL2 defining the occurrence of 4 to 7 fail bits among the data BL<0:5>.

The number of fail bits corresponding to the address Address #1 may be 0 and thus all the bits may have a low level within the corrected counting signal Q<0:5>. Therefore, the fail flag might not be generated by keeping sections of the data BL<0:5> to a low level.

The number of fail bits corresponding to the address Address #2 may be 1 and thus only the bit Q0 may have a high level within the corrected counting signal Q<0:5>. Therefore, the fail flag may be generated according to the bit Q0 having a high level at a time point corresponding to the data BL0 defining the occurrence of a single fail bit among the data BL<0:5>.

The number of fail bits corresponding to the address Address #3 may be 2 and thus only the bit Q1 may have a high level within the corrected counting signal Q<0:5>. Therefore, the fail flag may be generated according to the bit Q1 having a high level at a time point corresponding to the data BL1 defining the occurrence of 2 or 3 fail bits among the data BL<0:5>.

The number of fail bits corresponding to the address Address #4 may be 8 and thus only the bit Q3 may have a high level within the corrected counting signal Q<0:5>. Therefore, the fail flag may be generated according to the bit Q3 having a high level at a time point corresponding to the data BL3 defining the occurrence of 8 to 15 fail bits among the data BL<0:5>.

Referring back to FIG. 7, it may be determined whether a number of fail bits, which is counted in step S102, is '0' (S103).

When the counted number of fail bits is determined as '0' in step S103, a corresponding address may be stored in the first register group REG 1-1 to REG 1-m (S103-1).

Here, the fail flag might not be generated when the counted number of fail bits is determined as '0'.

In step S103-1, a first address corresponding to the counted number of fail bits determined as '0' may be stored in a register REG 1-1 within the first register group REG 1-1 to REG 1-m. Whenever a subsequent address corresponding to the counted number of fail bits determined as '0' occurs as the scan operation keeps being performed, the subsequent address may be stored in the first register group REG 1-1 to REG 1-m in an ascending order from a register REG 1-2 to a register REG 1-m.

When the counted number of fail bits is determined not as '0' in step S103, it may be determined whether a number of fail bits, which is counted in step S102, is '1' (S104).

When the counted number of fail bits is determined as '1' in step S104, the fail bit may be generated in the data BL0 corresponding to the input/output pad DQ0 and a corresponding address may be stored in the second register group REG 2-1 to REG 2-m (refer to FIG. 2) (S104-1).

In step S104-1, a first address corresponding to the counted number of fail bits determined as '1' may be stored in a register REG 2-1 within the second register group REG 2-1 to REG 2-m. Whenever a subsequent address corresponding to the counted number of fail bits determined as '1' occurs as the scan operation keeps being performed, the subsequent address may be stored in the second register group REG 2-1 to REG 2-m in an ascending order from a register REG 2-2 to a register REG 2-m.

When the counted number of fail bits is determined not as '1' in step S104, it may be determined whether a number of fail bits, which is counted in step S102, is '2' or '3' (S105).

When the counted number of fail bits is determined as '2' or '3' in step S105, the fail bit may be generated in the data BL1 corresponding to the input/output pad DQ0 and a corresponding address may be stored in the third register group REG 3-1 to REG 3-m (refer to FIG. 2) (S105-1).

In step S105-1, a first address corresponding to the counted number of fail bits determined as '2' or '3' may be stored in a register REG 3-1 within the third register group REG 3-1 to REG 3-m. Whenever a subsequent address corresponding to the counted number of fail bits determined as '2' or '3' occurs as the scan operation keeps being performed, the subsequent address may be stored in the third register group REG 3-1 to REG 3-m in an ascending order from a register REG 3-2 to a register REG 3-m.

When the counted number of fail bits is determined not as '2' or '3' in step S105, it may be determined whether a number of fail bits, which is counted in step S102, is '4' to '7' (S106).

When the counted number of fail bits is determined as '4' to '7' in step S106, the fail bit may be generated in the data BL2 corresponding to the input/output pad DQ0 and a corresponding address may be stored in the fourth register group REG 4-1 to REG 4-m (refer to FIG. 2) (S106-1).

In step S106-1, a first address corresponding to the counted number of fail bits determined as '4' to '7' may be stored in a register REG 4-1 within the fourth register group REG 4-1 to REG 4-m. Whenever a subsequent address corresponding to the counted number of fail bits determined as '4' to '7' occurs as the scan operation keeps being performed, the subsequent address may be stored in the fourth register group REG 4-1 to REG 4-m in an ascending order from a register REG 4-2 to a register REG 4-m.

When the counted number of fail bits is determined not as '4' to '7' in step S106, it may be determined whether a number of fail bits, which is counted in step S102, is '8' to '15' (S107).

When the counted number of fail bits is determined as '8' to '15' in step S107, the fail bit may be generated in the data BL3 corresponding to the input/output pad DQ0 and a corresponding address may be stored in the fifth register group REG 5-1 to REG 5-m (refer to FIG. 2) (S107-1).

In step S107-1, a first address corresponding to the counted number of fail bits determined as '8' to '15' may be stored in a register REG 5-1 within the fifth register group REG 5-1 to REG 5-m. Whenever a subsequent address corresponding to the counted number of fail bits determined as '8' to '15' occurs as the scan operation keeps being performed, the subsequent address may be stored in the fifth register group REG 5-1 to REG 5-m in an ascending order from a register REG 5-2 to a register REG 5-m.

The host 200 may determine the reliability (i.e., operation performance) of a redundancy memory cell according to a location where a corresponding address is stored among the first register group REG 1-1 to REG 1-m to the $(n-1)^{th}$ register group REG n-1 to REG n-m of the register array 201.

When it is decided to repair the normal memory cells, the host 200 may preferentially utilize the addresses stored in the first register group REG 1-1 to REG 1-m. When all the addresses stored in the first register group REG 1-1 to REG 1-m are utilized, the host 200 may then utilize the addresses stored in the second register group REG 2-1 to REG 2-m to the $(n-1)^{th}$ register group REG n-1 to REG n-m in an ascending order of the register groups.

Figure 10:
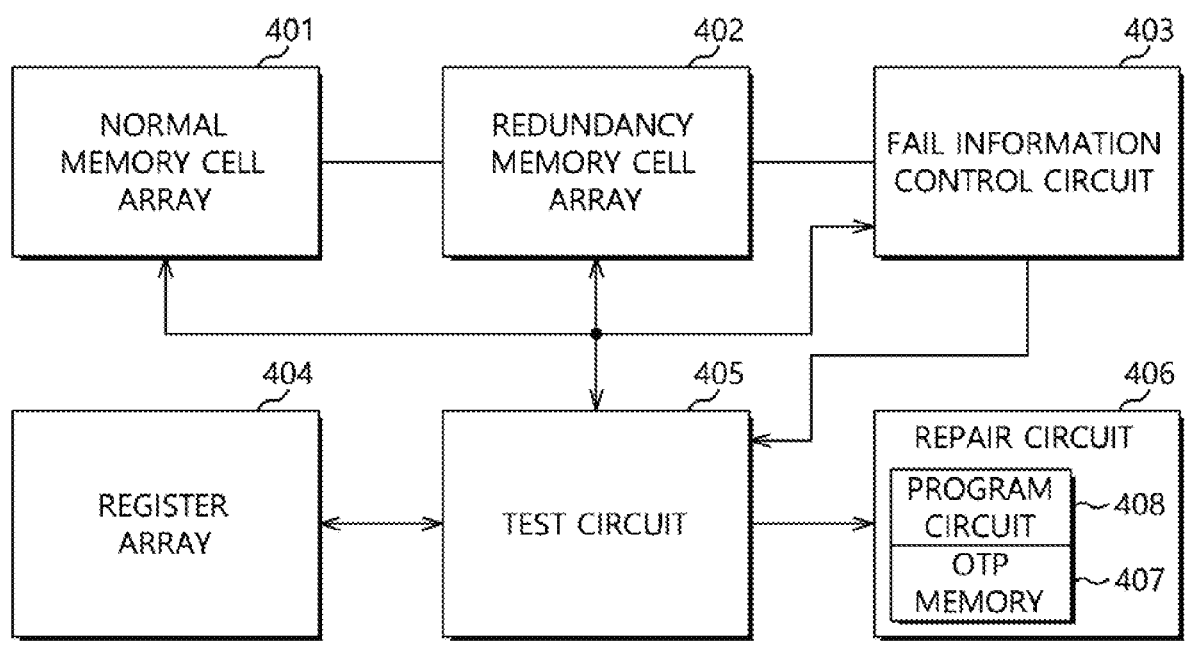
FIG. 10 is a diagram illustrating a representation of an example of a configuration of a semiconductor system in accordance with an embodiment of the present disclosure.

FIG. 10 is a diagram illustrating a representation of an example of a configuration of a semiconductor system in accordance with an embodiment of the present disclosure.

In accordance with the embodiment of the present disclosure described with reference to FIGS. 1 to 9, the corrected counting signal Q<0:K> may be included as the fail flag into the data BL<0:5> corresponding to the input/output pad DQ0 and may be provided to the host 200.

In accordance with the embodiment of the present disclosure related to FIG. 10, the corresponding addresses may be distinctively stored, according to the corrected counting signal Q<0:K>, into a first register group REG 1-1 to REG 1-m to a $(n-1)^{th}$ register group REG n-1 to REG n-m of a register array 404 within a semiconductor apparatus 400 and a repair operation may be performed on the basis of the addresses stored in the register groups of the register array 404 within the semiconductor apparatus 400. Therefore, there is no need to provide a fail flag to an external of the semiconductor apparatus 400.

Referring to FIG. 10, in accordance with an embodiment, the semiconductor apparatus 400 may include a normal memory cell array 401, a redundancy memory cell array 402, a fail information control circuit 403, a register array 404, a test circuit 405 and a repair circuit 406.

The normal memory cell array 401, the redundancy memory cell array 402, the fail information control circuit 403 and the register array 404 may be configured in the same way respectively as the normal memory cell array 301, the redundancy memory cell array 302, the fail information control circuit 303 and the register array 201 illustrated in FIG. 1, and may operate in the same way as described with reference to FIGS. 1 to 9.

The repair circuit 406 may include a one-time programmable (OTP) memory 407 and a program circuit 408.

The OTP memory 407 may be configured in the same way as the OTP memory 304 illustrated in FIG. 1.

The program circuit 408 may program a defective address into the OTP memory 407.

The program circuit 408 may program a defective address into the OTP memory 407 by selectively rupture electrical fuses of the OTP memory 407.

A fuse rupture operation is an operation of breaking a gate insulating layer of a transistor configuring an electrical fuse by applying a high voltage to the electrical fuse. A defective address may be programmed through a selective rupture operation suitable for a value of the defective address on the plurality of electrical fuses.

The repair circuit 406 may control an operation of programming a defective address into the OTP memory 407 and an operation of accessing an address corresponding to a redundancy memory cell instead of a defective address when an externally provided address is the defective address in a normal operation.

The test circuit 405 may be configured to test by itself the normal memory cell array 401 and the redundancy memory cell array 402 without control from an external of the semiconductor apparatus 400. For example, the test circuit 405 may include a built-in self-test circuit.

The test circuit 405 may store write data of a predetermined pattern into a normal memory cell and/or a redundancy memory cell corresponding to an address and may provide the fail information control circuit 403 with read data output from a normal memory cell and/or a redundancy memory cell.

The test circuit 405 may store addresses corresponding to read data into a selected one among the first register group REG 1-1 to REG 1-$m$ to the (n-1)$^{th}$ register group REG n-1 to REG n-$m$ of the register array 404, the selected register group corresponding to the corrected counting signal Q<0:K> output from the fail information control circuit 403.

The test circuit 405 may determine the reliability (i.e., operation performance) of redundancy memory cells according to locations where addresses corresponding to the redundancy memory cells are stored among the first register group REG 1-1 to REG 1-$m$ to the (n-1)$^{th}$ register group REG n-1 to REG n-$m$ of the register array 404.

When it is decided to replace the normal memory cells, the test circuit 405 may control the repair circuit 406 to preferentially utilize the addresses stored in the first register group REG 1-1 to REG 1-$m$.

When all the addresses stored in the first register group REG 1-1 to REG 1-$m$ are utilized, the test circuit 405 may then control the repair circuit 406 to utilize the addresses stored in the second register group REG 2-1 to REG 2-$m$ to the (n-1)$^{th}$ register group REG n-1 to REG n-$m$ in an ascending order of the register groups.

While various embodiments have been described above, it will be understood to those skilled in the art that the embodiments described are by way of example only. Accordingly, the semiconductor apparatus and semiconductor system including the same should not be limited based on the described embodiments. Rather, the semiconductor apparatus and semiconductor system including the same described herein should only be limited in light of the claims that follow when taken in conjunction with the above description and accompanying drawings.

What is claimed is:

1. A semiconductor system comprising:
   a semiconductor apparatus including a normal memory cell array and a redundancy memory cell array for repairing a defective cell among memory cells within the normal memory cell array, and configured to output to an external a fail flag generated according to a number of fail bits within read data output from the redundancy memory cell array; and
   a host configured to store an address corresponding to the read data into a selected register group from among a plurality of register groups, the selected register group from among the plurality of register groups being matched to the fail flag;
   wherein the semiconductor apparatus is configured to include the fail flag into a burst length, which is output through a data input/output pad from among a plurality of data input/output pads.

2. The semiconductor system of claim 1,
   wherein the semiconductor apparatus is configured to include the fail flag into a burst length, which is output through a data input/output pad from among a plurality of data input/output pads, and
   wherein the number of fail bits is differently defined according to an order in which the fail flag is included within the burst length.

3. The semiconductor system of claim 1, wherein the semiconductor apparatus is configured to generate a counting signal by counting a number of fail bits through comparison between write data and the read data and configured to generate a corrected counting signal by correcting the counting signal.

4. The semiconductor system of claim 3, wherein the semiconductor apparatus is configured to include, as the fail flag, the corrected counting signal into a burst length output through a data input/output pad from among a plurality of data input/output pads.

5. The semiconductor system of claim 3, wherein the corrected counting signal is generated by resetting, to a low level, remaining bits other than a most significant bit having a high level among a plurality of bits of the counting signal.

6. The semiconductor system of claim 1,
   wherein the semiconductor apparatus is configured to generate a counting signal by counting a number of fail bits through comparison between write data and the read data, and
   wherein the semiconductor apparatus is configured to generate a corrected counting signal by resetting, to a low level, remaining bits other than a most significant bit having a high level among a plurality of bits of the counting signal.

7. The semiconductor system of claim 1, wherein the semiconductor apparatus further includes:
   a comparison circuit configured to generate a comparison result signal by comparing write data with the read data;
   a fail bit counter configured to generate a counting signal by counting the comparison result signal; and
   a counting signal correction circuit configured to reset, to a low level, remaining bits other than a most significant bit having a high level among a plurality of bits of the counting signal and configured to output the counting signal including the reset bits as a corrected counting signal.

8. The semiconductor system of claim 1,
   wherein the host is configured to store, according to the fail flag, an address corresponding to no fail bit or a smallest number of fail bits into a first one among a sequence of the plurality of register groups, and wherein the host is configured to store, according to the fail flag, an address corresponding to a relatively greater number of fail bits than the address stored in the first register group into a register group subsequent to the first register group among the sequence of the plurality of register groups.

9. The semiconductor system of claim 1, wherein the host is configured to preferentially utilize, when repairing the memory cells within the normal memory cell array, an address stored in a first one among a sequence of the plurality of register groups.

10. The semiconductor system of claim 1, wherein the fail flag indicates to the host which register group to select from the plurality of register groups to store the address, corresponding to the number of fail bits within the read data, into.

11. A semiconductor apparatus comprising:
a normal memory cell array;
a redundancy memory cell array for repairing a defective cell among memory cells within the normal memory cell array;
a fail information control circuit configured to generate information on a number of fail bits within read data output from a memory cell within the redundancy memory cell array;
a register array including a plurality of register groups; and
a test circuit configured to store write data into the memory cell within the redundancy memory cell array, configured to control the memory cell within the redundancy memory cell array to output the read data, and configured to store an address corresponding to the read data into a selected register group from among the plurality of register groups, the selected register group from among the plurality of register groups corresponding to the information on the number of fail bits within the read data;

wherein the fail information control circuit includes:
a comparison circuit configured to generate a comparison result signal by comparing the write data with the read data;
a fail bit counter configured to generate a counting signal by counting the comparison result signal; and a counting signal correction circuit configured to generate a corrected counting signal by resetting, to a low level, remaining bits other than a most significant bit having a high level among a plurality of bits of the counting signal and configured to output the corrected counting signal as the information on the number of fail bits within the read data.

12. The semiconductor apparatus of claim 11, wherein the test circuit includes a built-in self-test circuit.

13. The semiconductor apparatus of claim 11,
wherein the test circuit is configured to store, according to the information on the number of fail bits within the read data, an address corresponding to no fail bit or a smallest number of fail bits into a first one among a sequence of the plurality of register groups, and wherein the test circuit is configured to store, according to the information on the number of fail bits within the read data, an address corresponding to a relatively greater number of fail bits than the address stored in the first register group into a register group subsequent to the first register group among the sequence of the plurality of register groups.

14. The semiconductor apparatus of claim 11, further comprising a repair circuit configured to control an operation of programming a defective address corresponding to the defective cell into a one-time programmable (OTP) memory and an operation of accessing an address corresponding to the memory cell within the redundancy memory cell array instead of the defective address when an externally provided address is the defective address in a normal operation.

15. The semiconductor apparatus of claim 14, wherein the test circuit is configured to control the repair circuit to preferentially utilize, when repairing the memory cells within the normal memory cell array, an address stored in a first one among a sequence of the plurality of register groups.

16. The semiconductor apparatus of claim 11, wherein the number of fail bits determines which register group is selected, by the test circuit, from the plurality of register groups, to store the address, corresponding to the number of fail bits within the read data, into.

* * * * *